United States Patent
Fu

(10) Patent No.: US 7,989,142 B2
(45) Date of Patent: Aug. 2, 2011

(54) PHOTO-MASKING METHOD FOR FABRICATING TFT ARRAY SUBSTRATE

(75) Inventor: Jian-Jhong Fu, Miao-Li (TW)

(73) Assignee: Chimel Innolux Corporation, Miao-Li County (TW)

( * ) Notice: Subject to any disclaimer, the term of this patent is extended or adjusted under 35 U.S.C. 154(b) by 885 days.

(21) Appl. No.: 11/725,700

(22) Filed: Mar. 19, 2007

(65) Prior Publication Data

US 2007/0218581 A1 Sep. 20, 2007

(30) Foreign Application Priority Data

Mar. 17, 2006 (TW) ................ 95109292 A

(51) Int. Cl.
*H01L 29/10* (2006.01)
*H01L 21/02* (2006.01)

(52) U.S. Cl. ........ 430/311; 430/313; 430/317; 430/318; 257/53; 438/48

(58) Field of Classification Search .......... None
See application file for complete search history.

(56) References Cited

U.S. PATENT DOCUMENTS

| | | |
|---|---|---|
| 5,926,702 A | 7/1999 | Kwon et al. |
| 6,016,174 A | 1/2000 | Endo et al. |
| 6,683,668 B2 * | 1/2004 | Moon et al. ............ 349/138 |
| 2004/0012554 A1 * | 1/2004 | Song et al. ............ 345/92 |
| 2004/0126950 A1 * | 7/2004 | Kim et al. ............ 438/197 |
| 2006/0024895 A1 | 2/2006 | Kim |
| 2006/0194376 A1 | 8/2006 | Baek et al. |

FOREIGN PATENT DOCUMENTS

| | | |
|---|---|---|
| CN | 1195121 A | 10/1998 |
| CN | 1825596 A | 8/2006 |

* cited by examiner

*Primary Examiner* — Daborah Chacko-Davis
(74) *Attorney, Agent, or Firm* — Wei Te Chung

(57) ABSTRACT

An exemplary method for fabricating a TFT array substrate includes providing an insulating substrate (201); coating a gate metal layer (202) on the substrate; forming a plurality of gate electrodes (212) using a first photo-mask process; forming a gate insulating layer (203), a semiconducting layer (205), and a source/drain metal layer (206) on the substrate having the gate electrodes; forming a plurality of source electrodes (217) and a plurality of drain electrodes (218) using a second photo-mask process; forming a passivation material layer (209) and a photo resist layer on the gate insulating layer, the source electrodes and the drain electrodes; forming a passivation layer (219) and the photo resist pattern (234) using a third photo-mask process; forming a transparent conductive metal layer (204) on the photo resist pattern, the drain electrode and the gate insulating layer; and forming a pixel electrode (214) through removing the photo resist pattern.

15 Claims, 6 Drawing Sheets

PHOTO-MASKING METHOD FOR FABRICATING TFT ARRAY SUBSTRATE

CROSS-REFERENCE TO RELATED APPLICATION

This application is related to, and claims the benefit of, a foreign priority application filed in Taiwan as Serial No. 095109292 on Mar. 17, 2006. The related application is incorporated herein by reference.

FIELD OF THE INVENTION

The present invention relates to thin film transistor (TFT) array substrates used in liquid crystal displays (LCDs) and methods of fabricating these substrates, and particularly to a TFT array substrate and a method for fabricating the substrate which efficiently uses minimal photo-masking.

GENERAL BACKGROUND

A typical liquid crystal display (LCD) is capable of displaying a clear and sharp image through millions of pixels that make up the complete image. The liquid crystal display has thus been applied to various electronic equipments in which messages or pictures need to be displayed, such as mobile phones and notebook computers. A liquid crystal panel is a major component of the LCD, and generally includes a thin film transistor (TFT) array substrate, a color filter substrate opposite to the TFT array substrate, and a liquid crystal layer sandwiched between the two substrates.

Referring to FIG. 17, part of a typical TFT array substrate is shown. The TFT array substrate 100 includes a substrate 101, a gate electrode 102 formed on the substrate 101, a gate insulating layer 103 formed on the substrate 101 having the gate electrode 102, a semiconducting layer 104 formed on the gate insulating layer 103, a source electrode 105 and a drain electrode 106 formed on the gate insulating layer 103 and the semiconducting layer 104, a passivation layer 107 formed on the gate insulating layer 103, the source electrode 105 and the drain electrode 106, and a pixel electrode 108 formed on the passivation layer 107.

Referring to FIG. 18, this is a flowchart summarizing a typical method for fabricating the TFT array substrate 100. For simplicity, the flowchart and the following description are couched in terms that relate to the part of the TFT array substrate 100 shown in FIG. 17. The method includes: step S10, forming a gate metal layer; step S11, forming a gate electrode; step S12, forming a gate insulating layer and an amorphous silicon (a-Si) and doped a-Si layer, step S13, forming a semiconducting layer on the gate insulating layer, step S14, forming a source/drain metal layer; step S15, forming source/drain electrodes; step S16, forming a passivation material layer; step S17, forming a passivation layer; step S18, forming a transparent conductive layer, and step S19, forming a pixel electrode.

In step S10, an insulating substrate is provided. The substrate may be made from glass or quartz. A gate metal layer and a first photo-resist layer are formed on the substrate.

In step S11, the first photo-resist layer is exposed by a first photo-mask, and then is developed, thereby forming a first photo-resist pattern. The gate metal layer is etched, thereby forming a pattern of the gate electrode 102, which corresponds to the first photo-resist pattern. The residual first photo-resist layer is then removed by an acetone solution.

In step S12, a gate insulating layer 103, an a-Si and doped a-Si layer, and a second photo-resist layer are sequentially formed on the substrate 101 having the gate electrode 102.

In step S13, the second photo-resist layer is exposed by a second photo-mask, and then is developed, thereby forming a second photo-resist pattern. The a-Si and doped a-Si layer is etched, thereby forming a pattern of the semiconducting layer 104, which corresponds to the second photo-resist pattern. The residual second photo-resist layer is then removed by an acetone solution.

In step S14, a source/drain metal layer and a third photo-resist layer are sequentially formed on the semiconducting layer 104.

In step S15, the third photo-resist layer is exposed by a third photo-mask, and then is developed, thereby forming a third photo-resist pattern. The source/drain metal layer is etched, thereby forming a pattern of the source electrode 105 and the drain electrode 106, which corresponds to the third photo-resist pattern. The residual third photo-resist layer is then removed by an acetone solution.

In step S16, a passivation material layer and a fourth photo-resist layer are sequentially formed on the substrate 101 having the three electrodes 102, 105, 106 formed thereon.

In step S17, the fourth photo-resist layer is exposed by a fourth photo-mask, and then is developed, thereby forming a fourth photo-resist pattern. The passivation material layer is etched, thereby forming a pattern of the passivation layer 107, which corresponds to the fourth photo-resist pattern. The residual fourth photo-resist layer is then removed by an acetone solution.

In step S18, a transparent conductive layer and a fifth photo-resist layer are sequentially formed on the passivation layer 107.

In step S19, the fifth photo-resist layer is exposed by a fifth photo-mask, and then is developed, thereby forming a fifth photo-resist pattern. The transparent conductive layer is etched, thereby forming a pattern of the pixel electrode 108, which corresponds to the fifth photo-resist pattern. The residual fifth photo-resist layer is then removed by an acetone solution.

The method includes five photo-mask processes, each of which is rather complicated and costly. Thus, the method for fabricating the TFT array substrate 100 is correspondingly complicated and costly.

What is needed, therefore, is a method for fabricating a TFT array substrate that can overcome the above-described problems. What is also needed is a TFT array substrate fabricated by the above method.

SUMMARY

In one preferred embodiment, a method for fabricating a thin film transistor (TFT) array substrate includes providing an insulating substrate; coating a gate metal layer on the substrate; forming a plurality of gate electrodes using a first photo-mask process; forming a gate insulating layer, a semiconducting layer, and a source/drain metal layer on the substrate having the gate electrodes; forming a plurality of source electrodes and a plurality of drain electrodes using a second photo-mask process, each of pairs of one source electrode and one drain electrode defining a channel therebetween; forming a passivation material layer and a photo resist layer on the gate insulating layer, the source electrodes and the drain electrodes; forming a passivation layer and the photo resist pattern using a third photo-mask process; forming a transparent conductive metal layer on the photo resist pattern, the drain electrode and the gate insulating layer; and forming a pixel electrode through removing the photo resist pattern.

Other advantages and novel features will become more apparent from the following detailed description when taken in conjunction with the accompanying drawings.

DETAILED DESCRIPTION OF PREFERRED EMBODIMENTS

Figure 1:
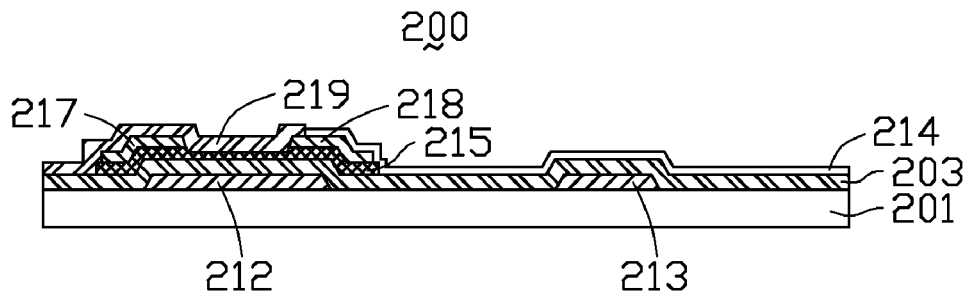
FIG. 1 is a schematic, side cross-sectional view of part of a TFT array substrate according to an exemplary embodiment of the present invention.

Referring to FIG. 1, part of a thin film transistor (TFT) array substrate according to an exemplary embodiment of the present invention is shown. The TFT array substrate 200 includes an insulating substrate 201, a gate electrode 212 formed on the insulating substrate 201, a common line 213 formed on the insulating substrate 201, a gate insulating layer 203 formed on the gate electrode 212 and the common line 213, a semiconducting layer pattern 215 formed on the gate insulating layer 203, a source electrode 217 and a drain electrode 218 formed on the semiconducting layer pattern 215, a passivation layer pattern 219 formed on the source electrode 217, the semiconducting layer pattern 215, and a pixel electrode 214 formed on the drain electrode 218 and the gate insulating layer 203.

Figure 2:
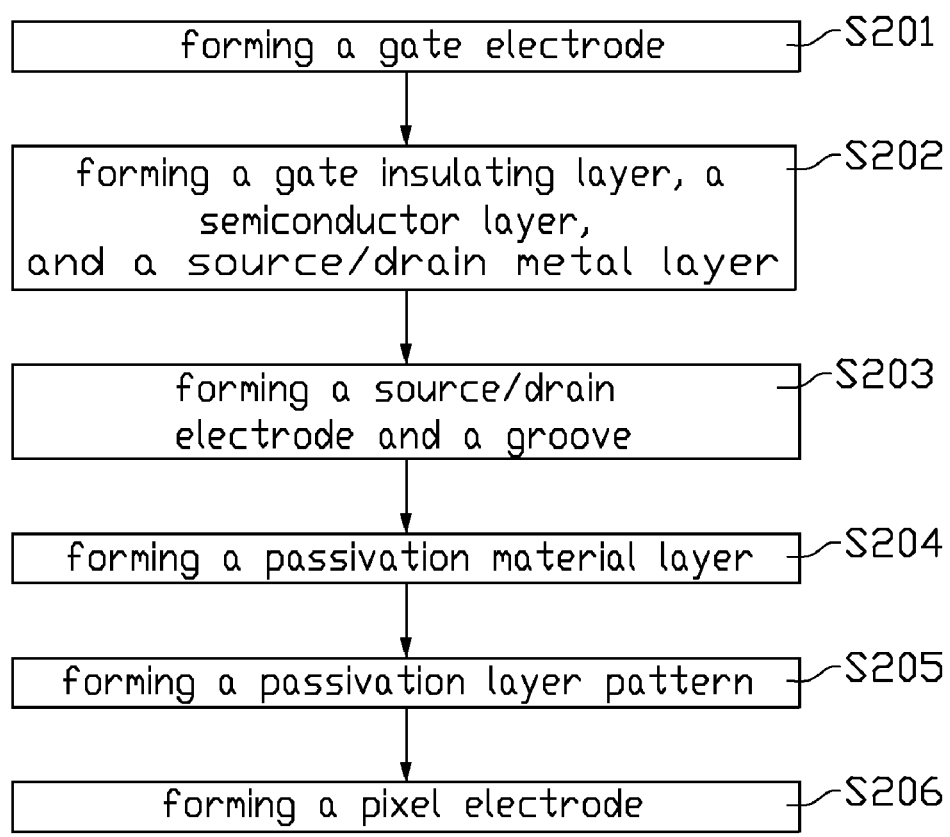
FIG. 2 is a flowchart summarizing an exemplary method for fabricating the TFT array substrate of FIG. 1.

Referring to FIG. 2, this is a flowchart summarizing an exemplary method for fabricating the TFT array substrate 200. For simplicity, the flowchart and the following description are couched in terms that relate to the part of the TFT array substrate 200 shown in FIG. 1. The method includes: step S201, forming a gate electrode; step S202, forming a gate insulating layer, a semiconducting layer, and a source/drain metal layer; step S203, forming a source/drain electrode and a groove; step S204, forming a passivation material layer; step S205, forming a passivation layer pattern; step S206, forming a pixel electrode.

Figure 3:
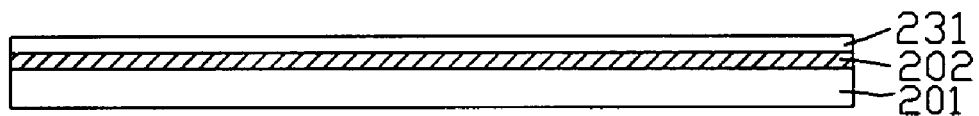
FIG. 3 is a schematic, side cross-sectional view relating to a step of providing a substrate and forming a gate metal layer and a first photo-resist layer on the substrate according to the method of FIG. 2.

In step S201, referring to FIG. 3, an insulating substrate 201 is provided. The substrate 201 may be made from glass or quartz. A gate metal layer 202, and a first photo-resist layer 231 are sequentially formed on the substrate 201. The gate metal layer 202 may be made from material including any one or more items selected from the group consisting of alumimun (Al), molybdenum (Mo), copper (Cu), chromium (Cr), and tantalum (Ta).

Figure 4:
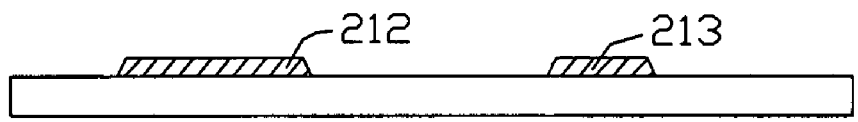
FIG. 4 is a schematic, side cross-sectional view relating to a next step of forming a gate electrode and a common line according to the method of FIG. 2.

Referring to FIG. 4, a light source (not shown) and a first photo-mask (not shown) are used to expose the first photo-resist layer 231. Then the exposed first photo-resist layer 231 is developed, thereby forming a first photo-resist pattern. Using the first photo-resist pattern as a mask, the gate metal layer 202 is etched, thereby forming the gate electrode 212 and the common line 213.

Figure 5:
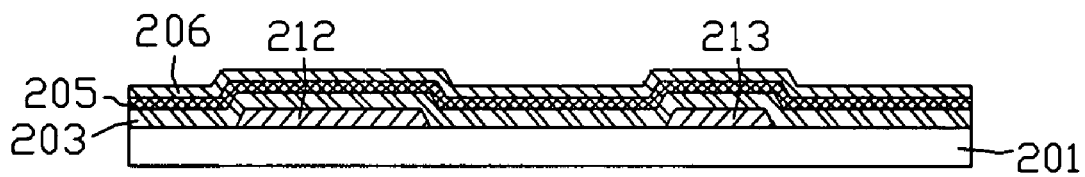
FIG. 5 is a schematic, side cross-sectional view relating to a next step of forming a gate insulating layer, a semiconducting layer, and a source/drain metal layer on the substrate having the gate electrode and the common line according to the method of FIG. 2.

In step S202, referring to FIG. 5, a gate insulating layer 203 is formed on the substrate 201 having the gate electrode 212 and the common line 213 by a chemical vapor deposition (CVD) process. In this process, silane (SiH4) reacts with alkaline air (NH4+) to obtain silicon nitride (SiNx), a material of the gate insulating layer 203. An amorphous silicon (a-Si) material layer is deposited on the gate insulating layer 203 by a CVD process. The a-Si layer is doped, thereby respectively forming a semiconducting layer 205. A source/drain metal layer 206 is then deposited on the semiconducting layer 205. The source/drain metal layer 206 may be made from material including any one or more items selected from the group consisting of aluminum, aluminum alloy, molybdenum, tantalum, and molybdenum-tungsten alloy.

Figure 6:
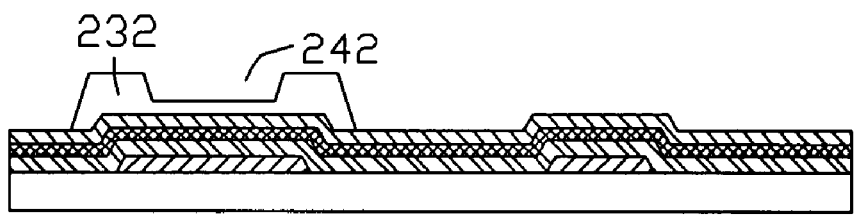
FIG. 6 is a schematic, side cross-sectional view relating to a next step of exposing a second photo-resist layer using a slit photo-mask according to the method of FIG. 2.

In step S203, a second photo-resist layer is coated on the source/drain metal layer 206. An ultra violet (UV) light source and a photo-mask (not shown) with a slit are used to expose the second photo-resist layer. Then the exposed second photo-resist layer is developed, thereby forming a second photo-resist pattern 232 having a groove 242, as shown in FIG. 6. A thickness of the second photo-resist pattern 232 beneath the groove 242 is less than a thickness of other portions of the second photo-resist pattern 232.

In an alternative embodiment, a photo-mask having transparent portions, opaque portions and semitransparent portions may be used to expose the second photo-resist layer in order to produce the second photo-resist pattern 232 having the groove 242. In another alternative embodiment, a light diffraction technique may also be used to produce the groove 242.

Figure 7:
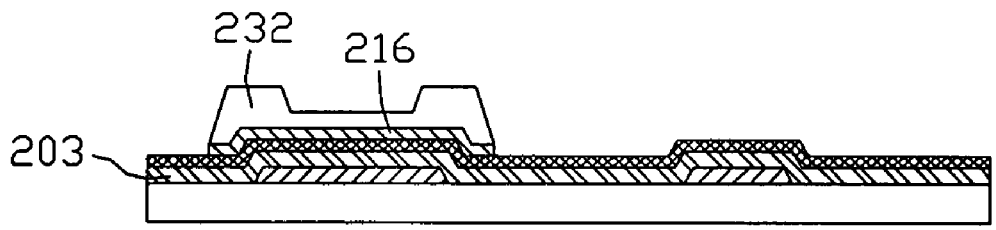
FIG. 7 is a schematic, side cross-sectional view relating to a next step of forming a source/drain pattern according to the method of FIG. 2.
Figure 8:
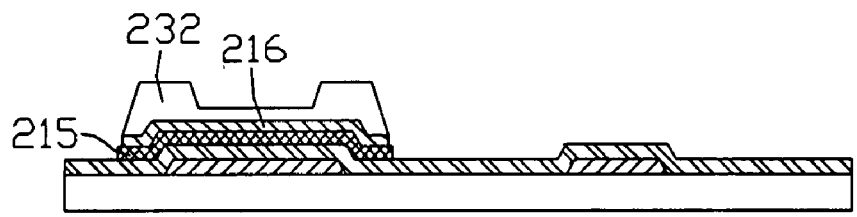
FIG. 8 is a schematic, side cross-sectional view relating to a next step of forming a semiconducting layer pattern according to the method of FIG. 2.
Figure 9:
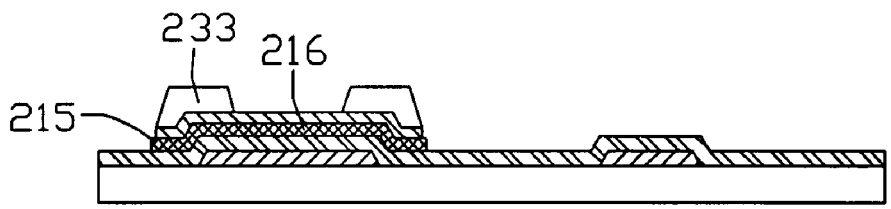
FIG. 9 is a schematic, side cross-sectional view relating to a next step of removing the second photo-resist layer at a groove thereof according to the method of FIG. 2.

Referring to FIG. 6, using the second photo-resist pattern 232 having the groove 242 as a mask, portions of the gate insulating layer 203, the semiconducting layer 205 and the source/drain metal layer 206 which are not covered by the second photo-resist pattern 232 are etched away, thereby forming the source/drain metal layer pattern 216 and the semiconducting layer pattern 215, as shown in FIG. 7 and FIG. 8. At the same time, the second photo-resist pattern 232 beneath the groove 242 is etched away, and thereby the source/drain metal layer pattern 216 corresponding to the groove 242 is exposed, as shown in FIG. 9.

Figure 10:
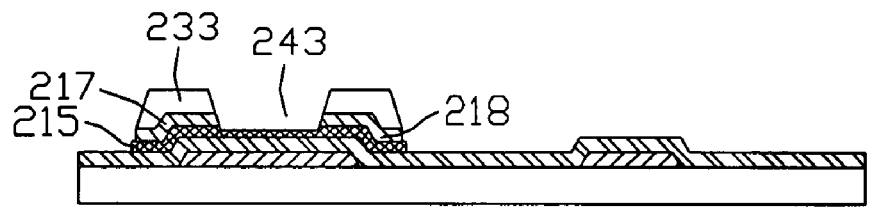
FIG. 10 is a schematic, side cross-sectional view relating to a next step of etching the source/drain pattern and the semiconducting layer pattern at a groove thereof according to the method of FIG. 2.
Figure 11:
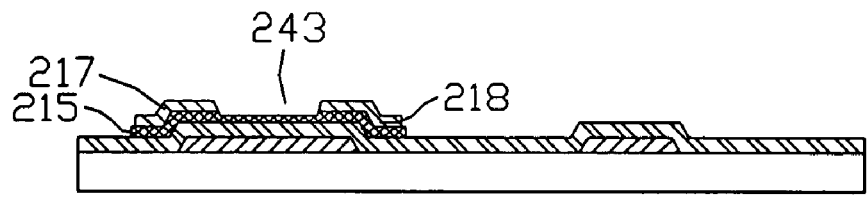
FIG. 11 is a schematic, side cross-sectional view relating to a next step of forming a source electrode, a drain electrode, and a channel between the two electrodes according to the method of FIG. 2.

Referring to FIG. 10, the source/drain metal layer 216 and a part of the semiconducting layer pattern 215 beneath the groove 242 are etched, thereby forming the source electrode 217, the drain electrode 218, and a channel 243 defined between the two electrodes 217, 218, as shown in FIG. 11.

Because the a-Si semiconducting layer 205 and the source/drain metal layer 206 are positioned adjacent to each other, only one photo-mask process is needed to form the source electrode 217, the drain electrode 218 and the channel 243. Compared to the above-described conventional method, another photo-mask process is saved, thus providing a further simplified method and further decreasing costs.

Figure 12:
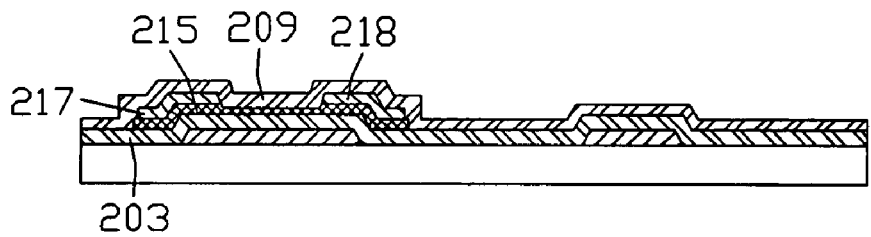
FIG. 12 is a schematic, side cross-sectional view relating to a next step of depositing a passivation layer on the source electrode, the drain electrode and the gate insulating layer according to the method of FIG. 2

In step S204, referring to FIG. 12, a passivation material layer 209 is deposited on the source electrode 217, the drain electrode 218, the semiconducting layer pattern 215 and the gate insulating layer 203.

Figure 13:
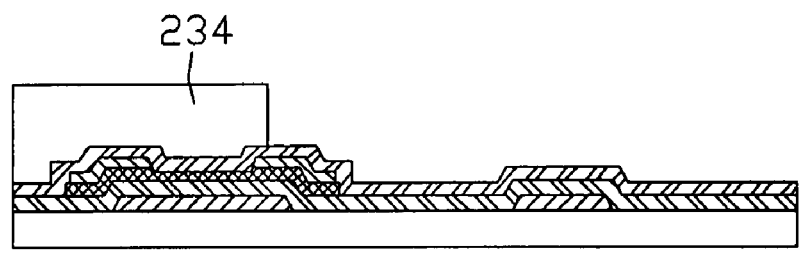
FIG. 13 is a schematic, side cross-sectional view relating to a next step of coating a third photo-resist layer pattern on the passivation layer according to the method of FIG. 2.
Figure 14:
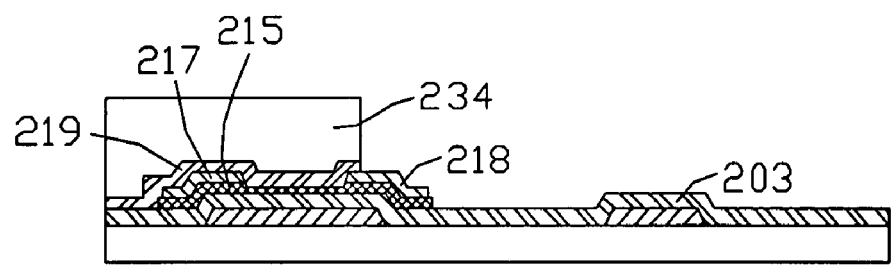
FIG. 14 is a schematic, side cross-sectional view relating to a next step of forming the passivation layer according to the method of FIG. 2.

In step S205, referring to FIG. 13, a third photo-resist layer is coated on the passivation material layer 209. A light source and a third photo-mask (not labeled) are used to expose the third photo-resist layer, thereby forming a third photo-resist pattern 234. Referring also to FIG. 14, a portion of the passivation material layer 209 not covered by the third photo-resist pattern 234 is etched away; thereby exposing the drain electrode 218 and a portion of the gate insulating layer 203 and forming a passivation layer 219 on the semiconducting layer pattern 215 and the gate insulating layer 203 and the source electrode 217.

Figure 15:
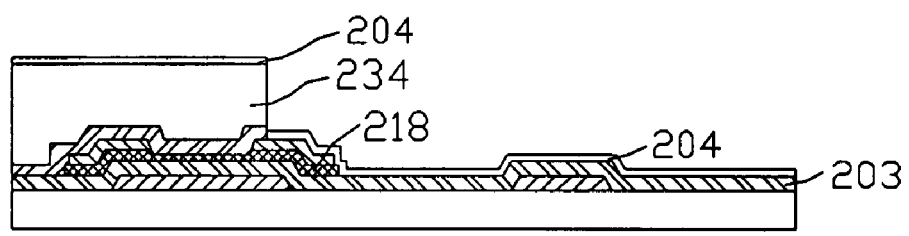
FIG. 15 is a schematic, side cross-sectional view relating to a step of depositing a transparent conductive metal layer according to the method of FIG. 2.
Figure 16:
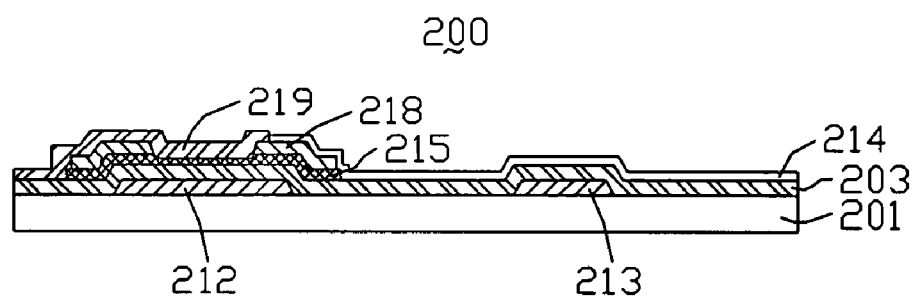
FIG. 16 is a schematic, side cross-sectional view relating to a step of forming a pixel electrode according to the method of FIG. 2.
Figure 17:
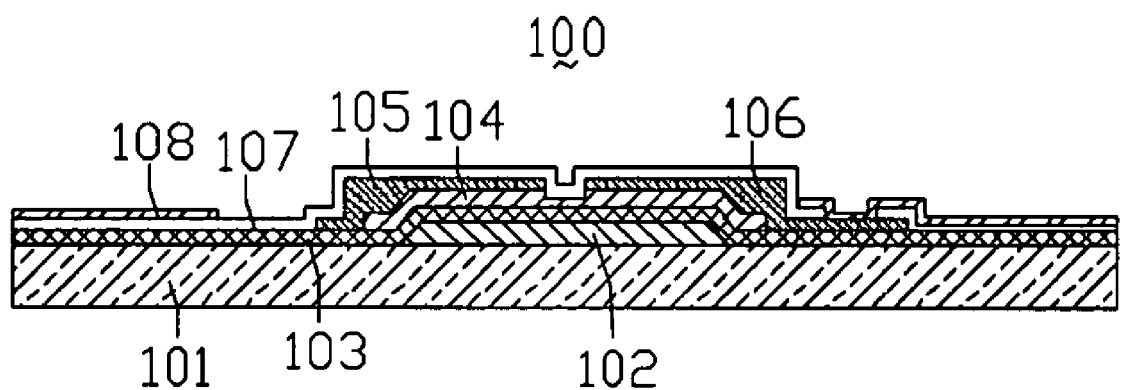
FIG. 17 is a schematic, side cross-sectional view of part of a conventional TFT array substrate.
Figure 18:
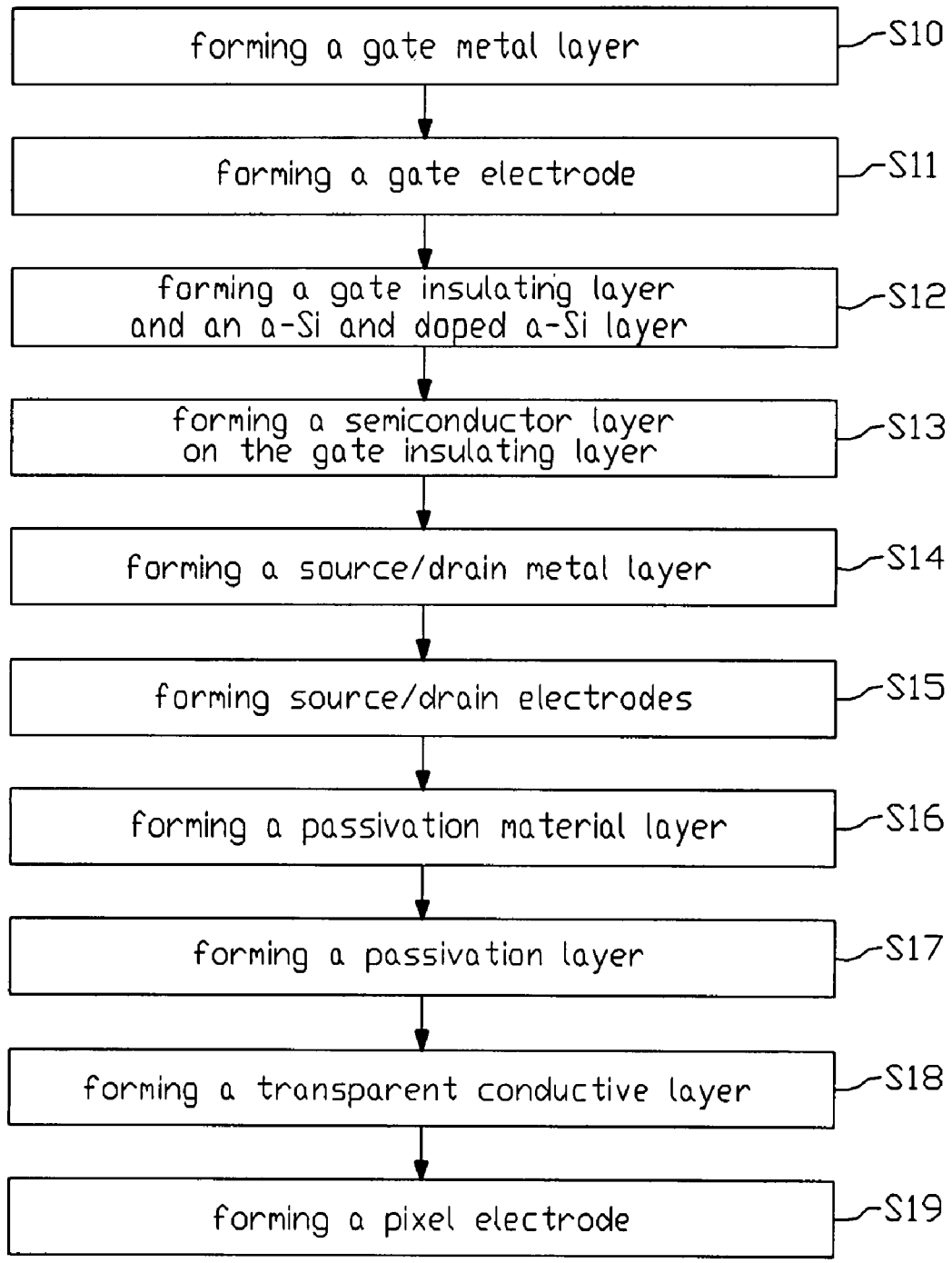
FIG. 18 is a flowchart summarizing a conventional method for fabricating the TFT array substrate of FIG. 17.

In step S206, referring to FIG. 15, a transparent conductive metal layer 204 is deposited on the third photo-resist pattern 234, exposed drain electrode 218 and a portion of the gate insulating layer 203. Also referring to FIG. 16, the third photo-resist pattern 234 and the transparent conductive metal layer 204 on the third photo-resist pattern 234 are then removed by an acetone solution. Thus the pixel electrode 214 is obtained.

In summary, compared to the above-described conventional method, in the above-described exemplary method for fabricating the TFT array substrate 200, only one photo-mask process is used to form the source electrode 217 and the drain electrode 218, and the channel 243, and only one photo-mask process is used to form the passivation layer 219 and the pixel electrode 214, thus saving two photo-mask processes. That is, the method for fabricating the TFT array substrate 200 only includes a total of three photo-mask processes. Therefore, a simplified method at a reduced cost is provided.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for fabricating a thin film transistor (TFT) array substrate, the method comprising:
   providing an insulating substrate;
   coating a gate metal layer on the substrate;
   forming a plurality of gate electrodes using a first photo-mask process;
   forming a gate insulating layer, a semiconducting layer, and a source/drain metal layer on the substrate having the gate electrodes;
   forming a plurality of source electrodes and a plurality of drain electrodes using a second photo-mask process, each of pairs of one source electrode and one drain electrode defining a channel therebetween;
   forming a passivation layer and a photo-resist layer on the gate insulating layer, the source electrodes and the drain electrodes;
   exposing the photo-resist layer using a third photo-mask process, thereby forming a photo-resist pattern, the photo-resist pattern exposing portions of the passivation layer, wherein each exposed portion of the passivation layer is above both a respective drain electrode and a portion of the gate insulating layer adjacent to the drain electrode;
   etching away the exposed portions of the passivation layer, thereby forming a patterned passivation layer, the patterned passivation layer being on the semiconducting layer, the gate insulating layer and the source electrodes and leaving the drain electrodes and the portions of the gate insulating layer exposed;
   forming a transparent conductive metal layer on the photo-resist pattern, the drain electrodes and the gate insulating layer; and
   forming a plurality of pixel electrodes through removing the photo-resist pattern and the transparent conductive metal layer on the photo-resist pattern.

2. The method as claimed in claim 1, wherein the second photo-mask process comprises coating another photo-resist layer on the source/drain metal layer, exposing the another photo-resist layer of the second photo-mask process using a photo-mask having a plurality of slits, and developing the exposed another photo-resist layer of the second photo-mask process to form another photo-resist pattern.

3. The method as claimed in claim 2, wherein the another photo-resist pattern of the second photo-mask process has a plurality of grooves.

4. The method as claimed in claim 2, wherein the second photo-mask process further comprises etching the another photo-resist layer of the second photo-mask process beneath the grooves, thereby exposing a portion of the source/drain metal layer corresponding to each groove.

5. The method as claimed in claim 2, wherein the second photo-mask process further comprises etching the source/drain metal layer and the semiconducting layer, thereby forming a source/drain metal layer pattern and a semiconducting layer pattern.

6. The method as claimed in claim 1, wherein the second photo-mask process further comprises depositing another photo-resist layer and utilizes a light diffraction technique to expose and develop the another photo-resist layer of the second photo-mask process.

7. The method as claimed in claim 1, wherein the second photo-mask process further comprises depositing another photo-resist layer and utilizes a photo-mask having transparent portions, opaque portions and semitransparent portions to expose the another photo-resist layer of the second photo-mask process to produce another photo-resist pattern having a plurality of grooves.

8. The method as claimed in claim 1, wherein the first photo-mask process comprises depositing another photo-resist layer on the gate metal layer and exposing the another photo-resist layer of the first photo-mask process by a photo-mask.

9. The method as claimed in claim 8, wherein the first photo-mask process further comprises etching the gate metal layer and removing residual portions of the another photo-resist layer of the first photo-mask process.

10. The method as claimed in claim 1, wherein the process of forming a plurality of gate electrodes further comprises forming a plurality of common lines at the same time.

11. The method as claimed in claim 1, wherein the substrate is made from glass or quartz.

12. The method as claimed in claim 1, wherein the transparent conductive layer is made from indium tin oxide or indium zinc oxide.

13. The method as claimed in claim 1, wherein the gate metal layer is made from material including any one or more items selected from the group consisting of aluminum, molybdenum, copper, chromium, and tantalum.

14. The method as claimed in claim 1, wherein the source/drain metal layer is made from material including any one or more items selected from the group consisting of aluminum, aluminum alloy, molybdenum, tantalum, and molybdenum-tungsten alloy.

15. A method for fabricating a thin film transistor (TFT) array substrate, the method comprising:
   providing an insulating substrate;
   coating a gate metal layer and a first photo-resist layer on the substrate;
   exposing the first photo-resist layer using a first photo-mask process, thereby forming a first photo-resist pattern;
   using the first photo-resist pattern as a mask, and etching the gate metal layer, thereby forming a plurality of gate electrodes;
   forming a gate insulating layer, a semiconducting layer, and a source/drain metal layer on the substrate having the gate electrodes;
   coating a second photo-resist layer on the source/drain metal layer;
   exposing the second photo-resist layer using a second photo-mask process, thereby forming a plurality of second photo-resist patterns, wherein each second photo-resist pattern has a groove, and a thickness of the second photo-resist pattern beneath the groove is less than a thickness of other portions of the second photo-resist pattern;
   using the plurality of second photo-resist patterns as a mask, and etching portions of the gate insulating layer, the semiconducting layer and the source/drain metal layer not covered by the plurality of second photo-resist patterns, thereby forming a source/drain metal layer pattern;
   etching each second photo-resist pattern beneath the groove, thereby exposing the source/drain metal layer pattern corresponding to the grooves;
   etching the source/drain metal layer and a part of the semiconducting layer pattern beneath the grooves, thereby forming a plurality of source electrodes, a plurality of drain electrodes, and a plurality of channels, each channel defined between a respective pair of one source electrode and one drain electrode;
   forming a passivation layer and a third photo-resist layer on the gate insulating layer, the source electrodes and the drain electrodes;
   exposing the third photo-resist layer using a third photo-mask process, thereby forming a third photo-resist pattern, the third photoresist pattern exposing portions of the passivation layer, wherein each exposed portion of the passivation layer is above both a respective drain electrode and a portion of the gate insulating layer adjacent to the drain electrode;
   etching away the exposed portions of the passivation layer, thereby forming a patterned passivation layer, the patterned passivation layer being on the semiconducting layer, the gate insulating layer and the source electrodes and leaving the drain electrodes and the portions of the gate insulating layer exposed;
   forming a transparent conductive metal layer on the third photo-resist pattern, the drain electrodes and the gate insulating layer; and
   forming a plurality of pixel electrodes through removing the third photo-resist pattern and the transparent conductive metal layer on the third photo-resist pattern.

* * * * *